US011657856B2

(12) United States Patent
Paraschou et al.

(10) Patent No.: US 11,657,856 B2
(45) Date of Patent: *May 23, 2023

(54) SENSE AMPLIFIER WITH INCREASED HEADROOM

(71) Applicant: Advanced Micro Devices, Inc., Santa Clara, CA (US)

(72) Inventors: Milam Paraschou, Santa Clara, CA (US); Jeffrey Cooper, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/113,346

(22) Filed: Dec. 7, 2020

(65) Prior Publication Data

US 2021/0090615 A1 Mar. 25, 2021

Related U.S. Application Data

(63) Continuation of application No. 16/368,311, filed on Mar. 28, 2019, now Pat. No. 10,861,507.

(51) Int. Cl.
*G11C 7/00* (2006.01)
*G11C 7/06* (2006.01)
*G11C 15/04* (2006.01)

(52) U.S. Cl.
CPC ............ *G11C 7/065* (2013.01); *G11C 15/04* (2013.01); *G11C 2207/063* (2013.01)

(58) Field of Classification Search
CPC .... G11C 7/065; G11C 15/04; G11C 2207/063
(Continued)

(56) References Cited

U.S. PATENT DOCUMENTS 5,355,391 A * 10/1994 Horowitz ............ G06F 13/4072
327/108
5,977,798 A * 11/1999 Zerbe .................. H04L 25/0292
327/55

(Continued)

OTHER PUBLICATIONS

Razavi, Behzad, "The StrongARM Latch", IEEE Solid-State Circuits Magazine, Jun. 22, 2015, pp. 12-17, vol. 7, Issue 2, IEEE, http://www.seas.ucla.edu/brweb/papers/Journals/BR_Magzine4. pdf. [Retrieved Feb. 11, 2019].

*Primary Examiner* — Ryan Jager
(74) *Attorney, Agent, or Firm* — Kowert Hood Munyon Rankin and Goetzel PC; Rory D. Rankin

(57) ABSTRACT

Systems, apparatuses, and methods for implementing a sampling circuit with increased headroom are disclosed. A sampling circuit includes at least a pair of input signal transistors connected via their drains to a cross-coupled pair of state nodes. The cross-coupled pair of state nodes are coupled to a tail transistor device via the sources of N-type transistors. When clock goes low, the circuit precharges the cross-coupled pair of state nodes while simultaneously attempting to amplify the difference between the pair of input signals. The amplification is performed by a pair of transistors in series between a source of each input signal transistor and ground. Each gate of the pair of transistors is connected to an inverted clock signal. When clock goes high, the circuit stops precharging and a voltage difference between the pair of input signals is regenerated to create a resulting differential voltage on the pair of state nodes.

20 Claims, 9 Drawing Sheets

(58) Field of Classification Search
USPC .......................................................... 327/49
See application file for complete search history.

(56) References Cited

U.S. PATENT DOCUMENTS

| | | | | |
|---|---|---|---|---|
| 6,147,514 | A * | 11/2000 | Shiratake | G11C 7/065 |
| | | | | 327/55 |
| 6,310,501 | B1 * | 10/2001 | Yamashita | H03K 3/356139 |
| | | | | 327/211 |
| 7,057,421 | B2 | 6/2006 | Shi | |
| 7,196,699 | B1 | 3/2007 | Kubota | |
| 10,200,025 | B2 * | 2/2019 | Yasotharan | H03K 7/02 |
| 10,447,290 | B2 * | 10/2019 | Ghosh | H03M 1/089 |
| 10,861,507 | B2 * | 12/2020 | Paraschou | G11C 7/1087 |
| 2018/0183422 | A1 * | 6/2018 | Yasotharan | G06F 13/4282 |
| 2019/0181873 | A1 | 6/2019 | Ghosh | |

* cited by examiner

SENSE AMPLIFIER WITH INCREASED HEADROOM

CROSS REFERENCE TO RELATED APPLICATIONS

This application is a continuation of U.S. patent application Ser. No. 16/368,311, entitled "SENSE AMPLIFIER WITH INCREASED HEADROOM", filed Mar. 28, 2019, the entirety of which is incorporated herein by reference.

BACKGROUND

Description of the Related Art

Modern semiconductor chips include a variety of circuits and components to facilitate fast and efficient computation. When transferring information between functional blocks in a semiconductor chip, electrical signals are typically sent on metal traces. Transmitters in a first functional block send the electrical signals across the metal traces. Receivers in a second functional block receive the electrical signals. In some cases, the two functional blocks are within a same die. In other cases, the two functional blocks are on separate dies.

The processing speed of information processing systems and devices continues to increase as new systems and devices are developed. Additionally, for high-speed signal transmission, signals are often transmitted at low amplitude levels. Extracting the data from these small signals is challenging as the amplitude levels decrease and as the data rates increase.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for implementing a sampling circuit with increased headroom are disclosed. In one implementation, a sampling circuit includes at least a pair of input signal transistors connected via their drains to a cross-coupled pair of state nodes. The pair of input signal transistors receive a pair of input signals on their gates. When an input clock signal goes low, the circuit precharges the cross-coupled pair of state nodes while simultaneously attempting to amplify the difference between the pair of input signals. The amplification is performed by a pair of transistors in series between each source of the pair of input signal transistors and ground. Each gate of each transistor of the pair of transistors is connected to an inverted input clock signal. Also, the cross-coupled pair of state nodes are coupled to a tail transistor via the sources of N-type transistors, with a non-inverted input clock signal connected to a gate of the tail transistor. When the input clock signal goes high, the circuit stops precharging and a voltage difference between the pair of input signals is amplified onto the pair of state nodes. This results in a differential voltage building up on the pair of state nodes based on the voltage difference between the pair of input signals. The differential voltage on the pair of state nodes is then inverted and passed on to an S-R latch which holds this value during the next precharge phase of the circuit.

In one implementation, in order to improve overall device headroom, voltage regeneration, and circuit speed at low supplies, the pre-charge portion and the sense and evaluation portion of the sampling circuit are split into two separate stacks. At low power supply levels, the split-stack sampling circuit architecture allow targeted specifications for blind period (i.e., the portion of the clock cycle around the data transition where small data amplitudes exist and an unpredictable sample can occur) and overall clock-to-Q (i.e., the time it takes for an output to be in a stable state after a clock edge occurs) to be met without significantly increasing power consumption.

Figure 1:
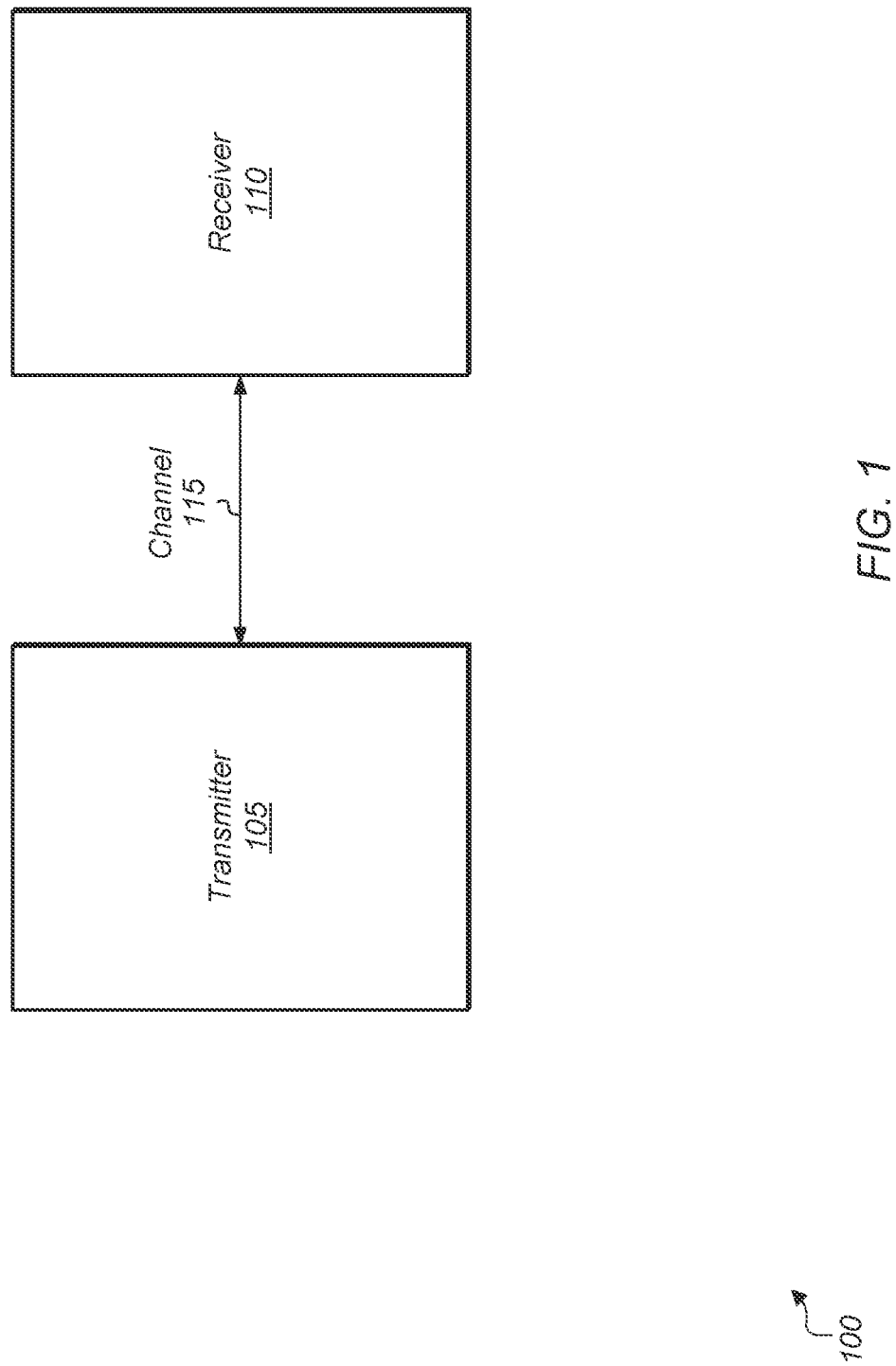
FIG. 1 is a block diagram of one implementation of generic computer or communication system including a transmitter and a receiver.

Referring now to FIG. 1, a block diagram of one implementation of a generic computer or communication system 100 including a transmitter 105 and a receiver 110 is shown. In one implementation, transmitter 105 transmits data to receiver 110 over communication channel 115. Depending on the implementation, communication channel 115 is a cable, backplane, one or more metal traces, or other type of communication channel. For example, in one implementation, channel 115 is one or more metal traces between two chips of a multi-chip module. At the physical layer, the communication between the transmitter 105 and the receiver device 110 can be unidirectional or bidirectional according to a given transmission protocol. It is noted that system 100 can include any number and type of other devices. Additionally, system 100 can include any number of transmitter-receiver pairs dispersed throughout the system.

Transmitter 105 and receiver 110 can be any type of devices depending on the implementation. For example, in one implementation, transmitter 105 is a processing unit (e.g., central processing unit (CPU), graphics processing unit (GPU)) and receiver 110 is a memory device. The memory device can be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices can be coupled onto a circuit board to form memory modules such as single inline memory modules (SIMMs), dual inline memory modules (DIMMs), etc.

Alternatively, the memory devices can be mounted within a system on chip (SoC) or integrated circuit (IC) in a chip-on-chip configuration, a package-on-package configuration, or a multi-chip module (MCM) configuration.

In another implementation, transmitter 105 is an input/output (I/O) fabric and receiver 110 is a peripheral device. The peripheral devices can include devices for various types of wireless communication, such as wifi, Bluetooth, cellular, global positioning system, etc. The peripheral devices can also include additional storage, including RAM storage, solid state storage, or disk storage. The peripheral devices can also include user interface devices such as a display screen, including touch display screens or multitouch display screens, keyboard or other input devices, microphones, speakers, etc. In other implementations, transmitter 105 and receiver 110 are other types of devices. It is noted that system 100 can be any type of system, such as an IC, SoC, MCM, and so on.

Figure 2:
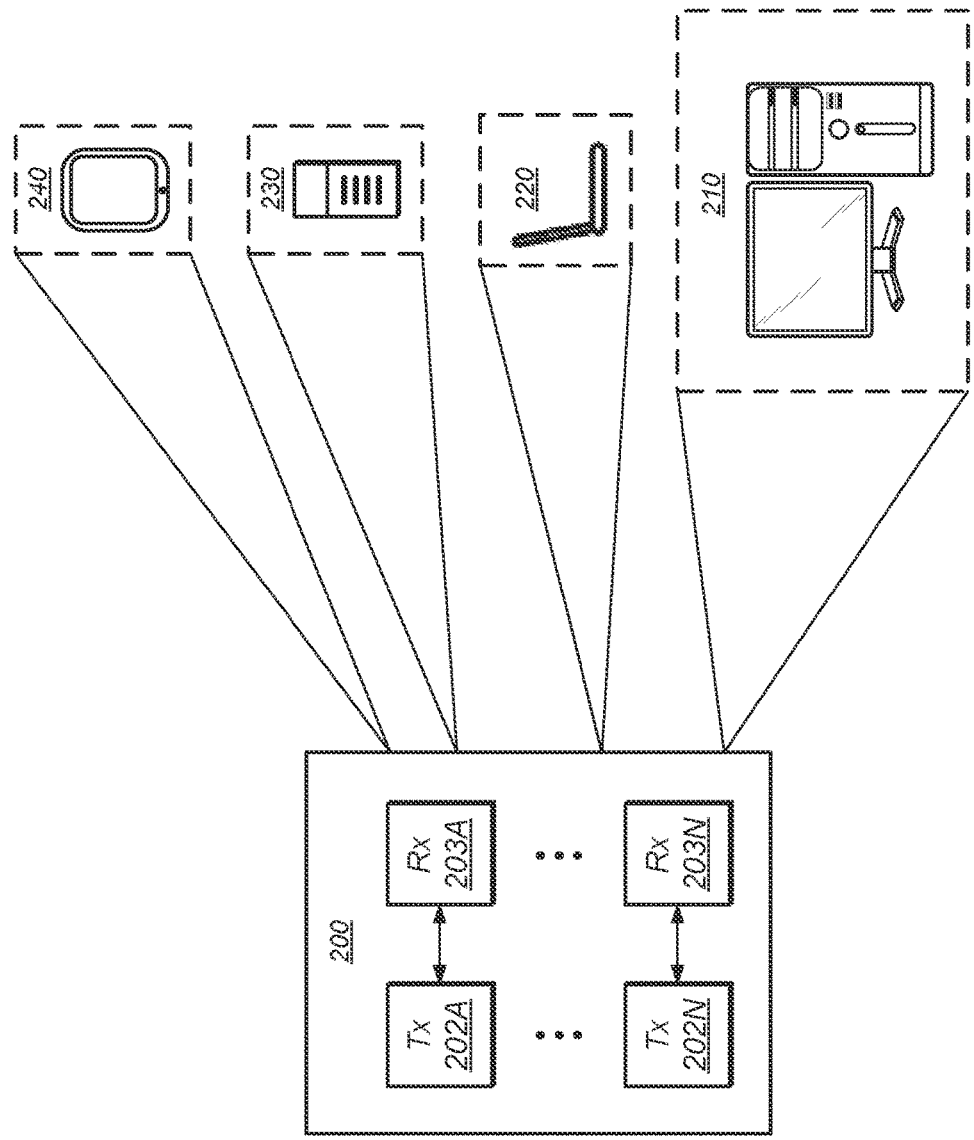
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes any number of pairs of transmitters 202A-N and receivers 203A-N.

Figure 3:
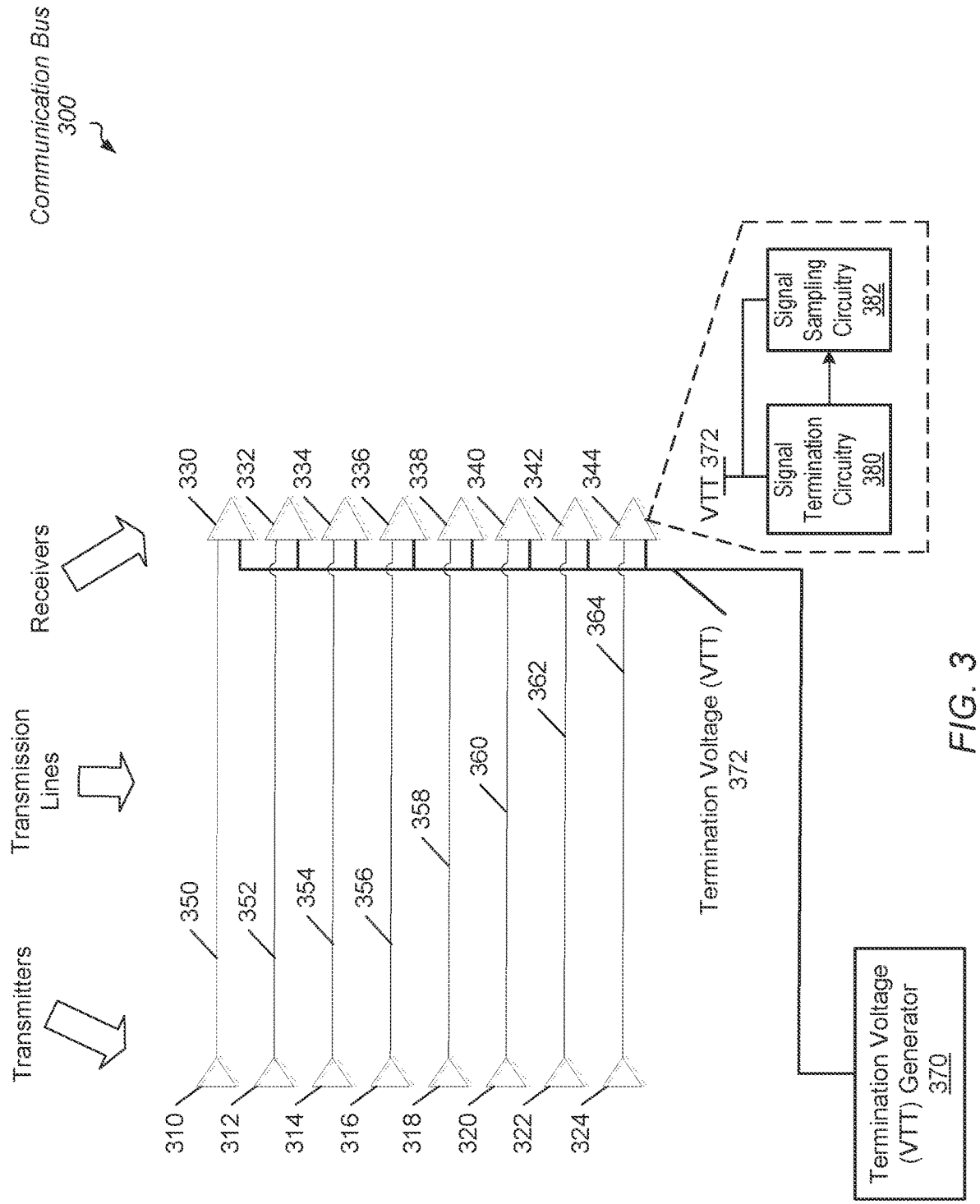
FIG. 3 is a generalized block diagram of one implementation of a communication bus.

Referring now to FIG. 3, a generalized block diagram of one implementation of a communication bus 300 is shown. As shown, communication bus 300 includes transmitters 310-324 for sending information as electrical signals, transmission lines 350-364 for transferring the electrical signals, and receivers 330-344 for receiving the electrical signals. Additionally, communication bus 300 includes a termination voltage (VTT) generator 370 for generating termination voltage (VTT) 372. Termination voltage (VTT) 372 can also be referred to herein as a "reference voltage". As shown, VTT 372 is sent to each of the receivers 330-344. In the illustrated implementation, receiver 344 couples VTT 372 to each of termination circuitry 380 and sampling circuitry 382.

It is noted that the term "bus" can also be referred to as a "channel," and each "transmission line" can also be referred to as a "lane" or a "trace" or a "wire." In various implementations, transmission lines 350-364 are constructed from a variety of suitable metal sources during semiconductor fabrication and surrounded by a variety of any suitable insulating material. It is also noted that the terms "pin," "port," "terminal," and "node" are used interchangeably herein. Although eight transmitters 310-324, eight transmission lines 350-364 and eight receivers 330-344 are shown, in other implementations, any number of these components are used.

In some implementations, the signals sent from transmitters 310-324 to receivers 330-344 are single-ended data signals. The term "single-ended signal" is defined as an electrical signal which is transmitted using a single signal conductor. For example, in an implementation, receiver 330 receives a single-ended signal from transmitter 310 via transmission line 350, which is a single signal conductor. In contrast to using single-ended data signals, sending information with differential data signals uses more lines and more pins. A reference signal is not generated and sent to multiple pins (or multiple receivers) when differential data signals are used. As is known in the art, differential signaling generally provides better noise immunity than single-ended signaling. However, the use of differential signaling comes at the added cost of extra pins and extra traces.

In order to better handle noise issues when using single-ended signaling, communication bus 300 uses VTT 372 in each of the signal termination circuitry 380 and the signal sampling circuitry 382. Any noise on one of the received input signals on transmission lines 350-364 and any noise on VTT 372 are tracked by each of the signal termination circuitry 380 and the signal sampling circuitry 382. In various implementations, a capacitance is used within VTT generator 370 to reduce noise on VTT 372 and keep VTT 372 as stable as possible. In some implementations, the capacitance used within VTT generator 370 is a lumped capacitance, whereas, in other implementations, this capacitance is a distributed capacitance. By limiting the noise on VTT 372 with this capacitance within VTT generator 370, the common mode noise received by samplers within the receivers 330-344 is also reduced. As shown in FIG. 3, when cross coupling capacitance on transmission lines 350-364 causes VTT 372 to change its value from its generated value, the change is received by each of the signal termination circuitry 380 and the signal sampling circuitry 382. For example, the signal sampling circuitry 382 receives a value generated by the signal termination circuitry 380 and compares it to a reference voltage, which is VTT 372.

Figure 4:
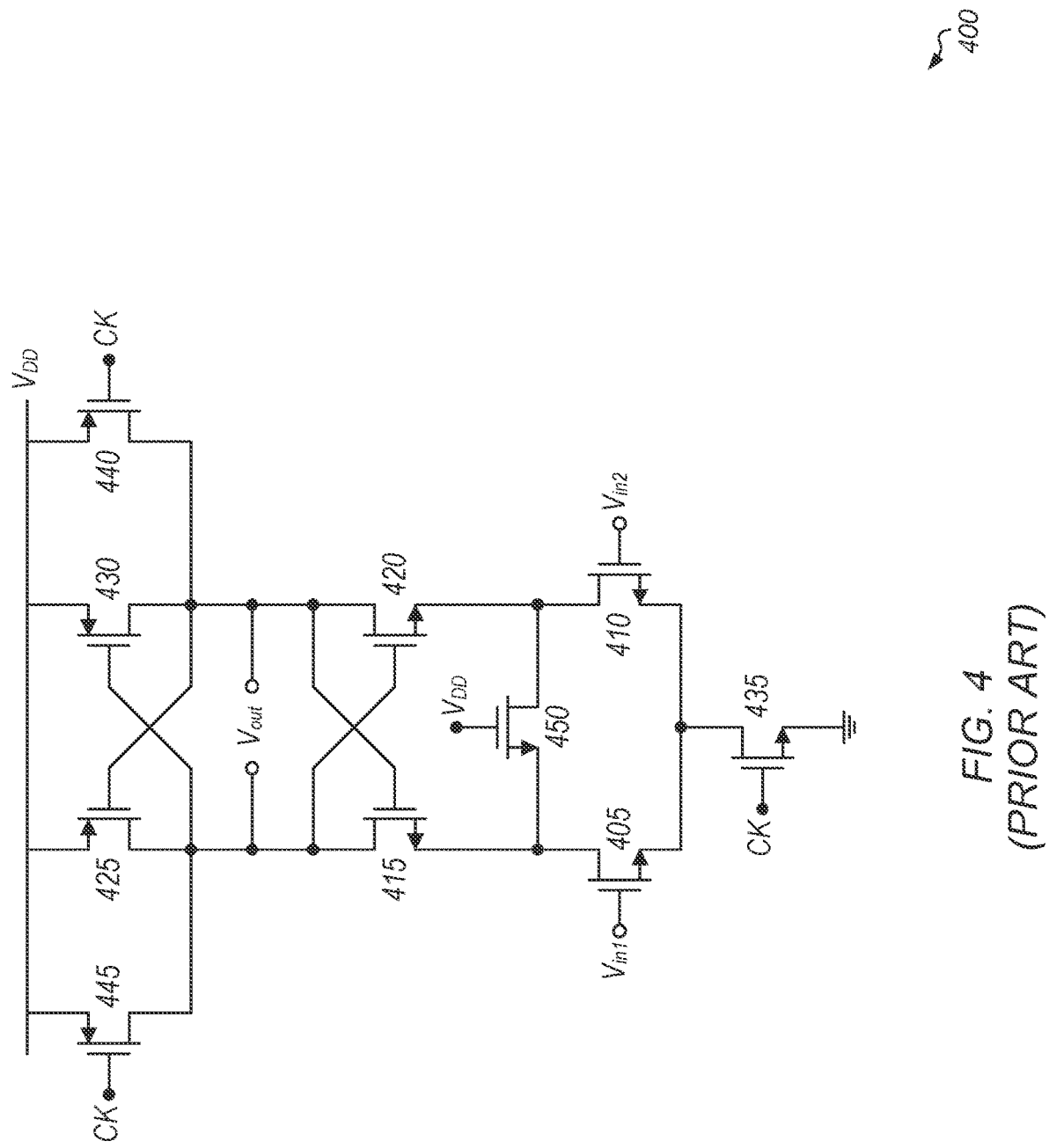
FIG. 4 is a diagram of a prior art implementation of a sense amplifier circuit.

Turning now to FIG. 4, a diagram of a prior art implementation of a sense amplifier circuit 400 is shown. The architecture of circuit 400 is also referred to as a strongARM architecture. Circuit 400 includes an input clock signal (CK) coupled to gates of P-type transistors 440 and 445 and N-type transistor 435. A pair of input signals are coupled to gates of N-type transistors 405 and 410. N-type transistor 450 is coupled in between the drains of transistors 405 and 410.

In general, circuit 400 operates in one of two phases depending on the value of the input clock signal (CK). First, during a precharge phase, when CK is low, transistors 440 and 445 precharge the $V_{out}$ nodes. Transistors 425 and 415 and transistors 430 and 420 serve as cross-coupled inverters. Then, when clock goes high, transistor 435 turns on, with the differential across $V_{in1}$ and $V_{in2}$ being resolved to a full rail signal on $V_{out}$.

Figure 5:
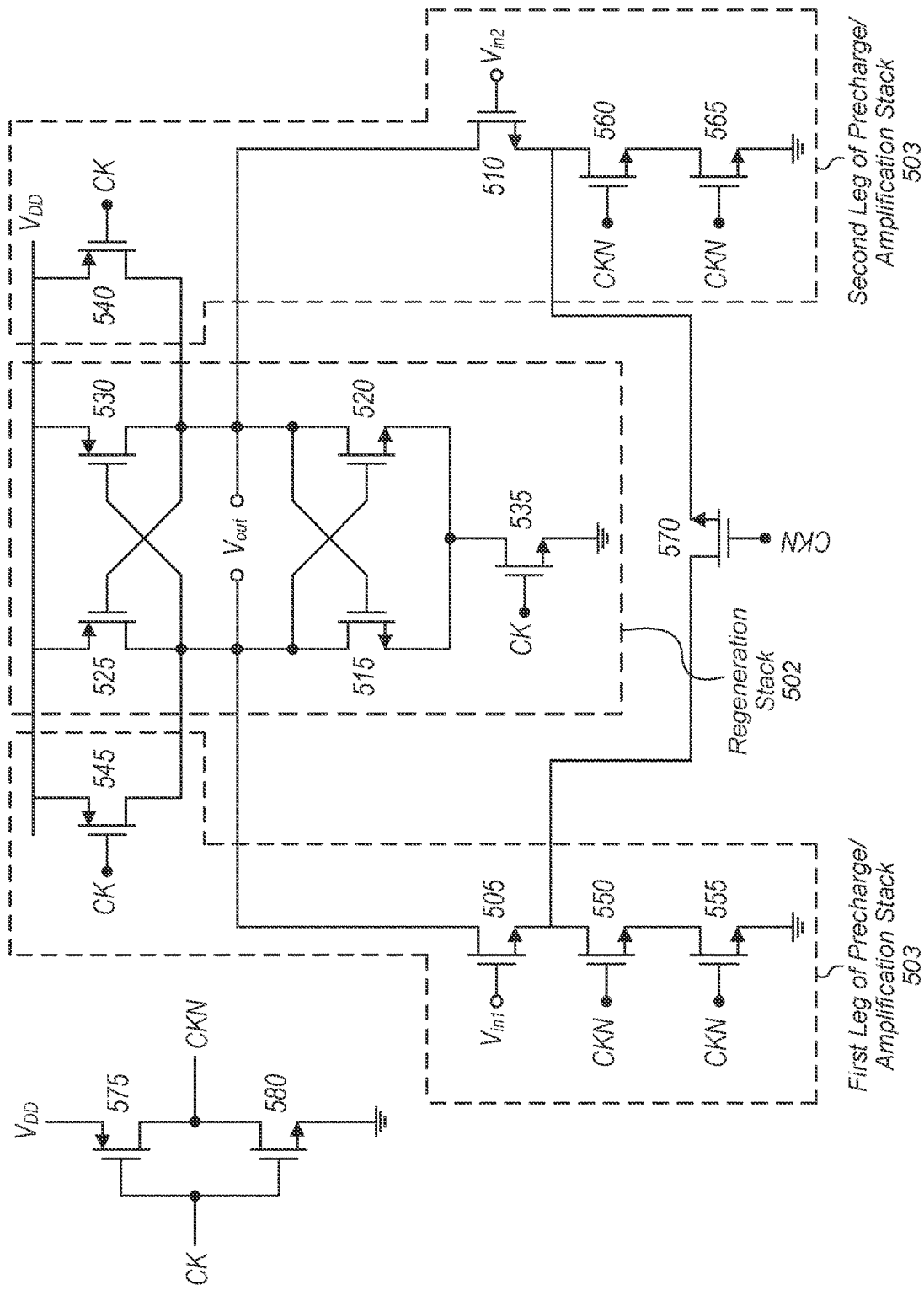
FIG. 5 is a diagram of one implementation of a circuit of a sense amplifier with increased headroom.

Referring now to FIG. 5, a diagram of one implementation of a circuit 500 of a sense amplifier with increased headroom is shown. In one implementation, circuit 500 is implemented as signal sampling circuitry 382 (of FIG. 3). The traditional implementation of a sense amplifier as shown in circuit 400 (of FIG. 4) uses a single stack. The single stack includes all of the devices which perform the amplification and regeneration in one differential, vertical stack. However, as shown in circuit 500, the traditional single vertical stack has been split into two separate stacks to improve the performance of circuit 500. The regeneration stack 502 terminates at transistor 535, while the two legs of the precharge/amplification stack 503 terminate at transistors 555 and 565. The traditional single stack of circuit 400 has four transistors in between the supply voltage and ground, while the regeneration stack 502 of circuit 500 has three transistors each from the supply voltage to ground.

It is noted that, in various implementations, a "transistor" can correspond to one or more transconductance elements such as a metal-oxide-semiconductor field-effect transistor (MOSFET), a junction field-effect transistor (JFET), a bipolar transistor, or others. For example, in one implementation, each p-type transistor is a p-type metal-oxide-semiconductor (PMOS) transistor and each n-type transistor is an n-type metal-oxide-semiconductor (NMOS) transistor. In other implementations, the p-type transistors and n-type transistors shown in circuit 500 can be implemented using other types of transistors. It is also noted that the terms n-type and p-type can be used interchangeably with n-channel and p-channel, respectively.

One difference between circuit 400 and circuit 500 is that a transistor 535 is added to the bottom of the regeneration stack 502. Transistor 535 acts like a current source when enabled. Transistor 535 is also referred to herein as a "tail transistor". In one implementation, transistor 535 is an N-type metal-oxide-semiconductor field-effect-transistor (MOSFET) device. In other implementations, transistor 535 is implemented using other types of devices.

The operational stages of circuit 500 can be described in terms of clock phases, with a first stage occurring when clock is low and a second stage occurring when clock is high. The first stage is a precharging stage for the cross-coupled state nodes labeled as $V_{out}$ in FIG. 5. The second stage of circuit 500 is the evaluate stage which takes the difference between the input signals $V_{in1}$ and $V_{in2}$ and amplifies the difference up to a full rail level. By splitting up the traditional single stack of circuit 400 into two stacks 502 and 503, there is a reduction in the amount of time it takes for the differential voltage present at $V_{in1}$ and $V_{in2}$ to be regenerated during the evaluate stage.

When the clock input is low, the transistors 540 and 545 are precharging the $V_{out}$ nodes. In the implementation shown for circuit 500, the $V_{out}$ nodes are the outputs of a cross-coupled inverter, with the cross-coupled inverter consisting of transistors 515, 520, 525, and 530. In one implementation, transistors 515 and 520 are implemented using N-type MOSFETs, and transistors 525 and 530 are implementing using P-type MOSFETs. When the clock input goes high, the $V_{out}$ nodes let go of their precharge state, and the tail device transistor 535 is turned on which amplifies the difference between $V_{in1}$ and $V_{in2}$. When the clock is low, transistor 535 is off. Also, when the clock input is low, the inverted clock input (CKN) is high, causing the stacked transistors 550 and 555 and the stacked transistors 560 and 565 to be on. It is noted that transistors 575 and 580 of FIG. 5 form an inverter to invert the input clock signal (CK) to create CKN. It is noted that while an inverter based on transistors 575 and 580 is depicted, in other embodiments different approaches to delivering clock input CK and an inverted clock input CKN are used. For example, the timing of CK vs. CKN can be adjusted to manage evaluating at the end of the pre-charge/amplification phase. In some embodiments, the delay is optimized using multiple inverters, or other phase delay methods, which further optimize the ability to perform the evaluation. These and other embodiments are possible and are contemplated.

The stacked transistors 550 and 555 and the stacked transistors 560 and 565 are working in opposition to the precharging action of transistors 540 and 545, respectively.

As a result, transistors 540 and 545 are trying to precharge the $V_{out}$ nodes, but not so much that a differential is not allowed to develop. This allows the $V_{out}$ nodes to develop a relatively small differential voltage based on the difference between $V_{in1}$ and $V_{in2}$, and then once the clock goes from low to high, stacked transistors 550 and 555, stacked transistors 560 and 565, and transistors 540 and 545 shut off. Also, when clock goes from low to high, the tail device (i.e., transistor 535) turns on, and the differential that was developed on the $V_{out}$ nodes gets resolved into a full rail signal. This full rail signal is then connected to a latch circuit (not shown) and passed on to a digital stage (not shown) or some other processing logic.

The entire regeneration stack 502, on either leg of the differential stack, is a stack from the supply voltage ($V_{DD}$) to ground. If there is a very small differential on $V_{in1}$ and $V_{in2}$, the circuit has to pull down the current on one side and pull it up on the other side. And the more devices that are included in the vertical regeneration stack 502, the longer it will take to pull down one side and pull up the other side because each device adds additional resistance. Circuit 500 has a reduction in the number of transistors per vertical stack as compared to the prior art circuit 400 (of FIG. 4). This results in a speed up in the evaluation time for the differential voltage on the $V_{out}$ nodes to go to a full rail signal because there are fewer devices in the vertical stack. This allows for circuit 500 to be used with faster clocks than circuits designed according to the prior art. This also allows for smaller differential signals on $V_{in1}$ and $V_{in2}$ to be resolved to full rail signals as compared to the prior art.

The remainder of the discussion of FIG. 5 will focus on the physical components and connections of circuit 500. The sources of transistors 540 and 545 are connected to the supply voltage ($V_{DD}$). The gates of transistors 540 and 545 are connected to the input clock signal. The drains of transistors 540 and 545 are connected to the drains of transistors 525 and 530, respectively. In one implementation, transistors 540 and 545 are P-type MOSFETs. It is noted that the gates of transistors can also be referred to as "gate terminals" or "gate nodes" of transistors. Similarly, sources can also be referred to as "source terminals" or "source nodes" and drains can also be referred to as "drain terminals" or "drain nodes" of transistors.

The sources of transistors 525 and 530 are connected to the supply voltage ($V_{DD}$). The gate of transistor 525 is connected to the drain of transistor 530, and the gate of transistor 530 is connected to the drain of transistor 525. The drain of transistor 515 is connected to the drain of transistor 525, and the drain of transistor 520 is connected to the drain of transistor 530. The drain of transistor 515 is the first output node and the drain of transistor 520 is the second output node. The first and second output nodes are also shown as $V_{out}$ in circuit 500. It is noted that transistors 525, 530, 515, and 520 can also be referred to herein as an internal cross-coupled pair of state nodes. The gate of transistor 515 is connected to the drain of transistor 520, and the gate of transistor 520 is connected to the drain of transistor 515. The source of transistor 515 is connected to both the source of transistor 520 and the drain of transistor 535. The gate of transistor 535 is connected to the input clock signal, and the source of transistor 535 is connected to ground.

The drain of transistor 505 is connected to the drain of transistor 515. The gate of transistor 505 is connected to one of the input signals ($V_{in1}$). The source of transistor 505 is connected to both the drain of transistor 550 and the drain of transistor 570. The source of transistor 550 is connected to the drain of transistor 555, and the source of transistor 555 is connected to ground. The drain of transistor 510 is connected to the drain of transistor 520. The gate of transistor 510 is connected to the second input signal ($V_{in2}$). The source of transistor 510 is connected to both the drain of transistor 560 and the source of transistor 570. The source of transistor 560 is connected to the drain of transistor 565, and the source of transistor 565 is connected to ground. The gates of transistors 550, 555, 560, 565, and 570 are connected to the inverted clock signal. In one implementation, transistors 550, 555, 560, 565, and 570 are N-type MOSFETs.

The inverted clock signal is generated by transistors 575 and 580. The input clock signal is connected to the gates of transistors 575 and 580. The source of transistor 575 is connected to the supply voltage ($V_{DD}$) and the source of transistor 580 is connected to ground. The drain of transistor 575 is connected to the drain of transistor 580. The connection point between the drain of transistor 575 and the drain of transistor 580 is the inverted clock signal. In one implementation, transistor 575 is a P-type MOSFET and transistor 580 is a N-type MOSFET.

It should be understood that circuit 500 represents one particular implementation of a sampling circuit with increased headroom. Other implementations of circuit 500 can be created using the split-stack approach described herein. For example, in another implementation, a complimentary version of circuit 500 can be created by swapping all of the N-type and P-type transistors. In other implementations, circuit 500 can include other arrangements of components with one or more of the illustrated components omitted and/or one or more additional components included within circuit 500.

Figure 6:
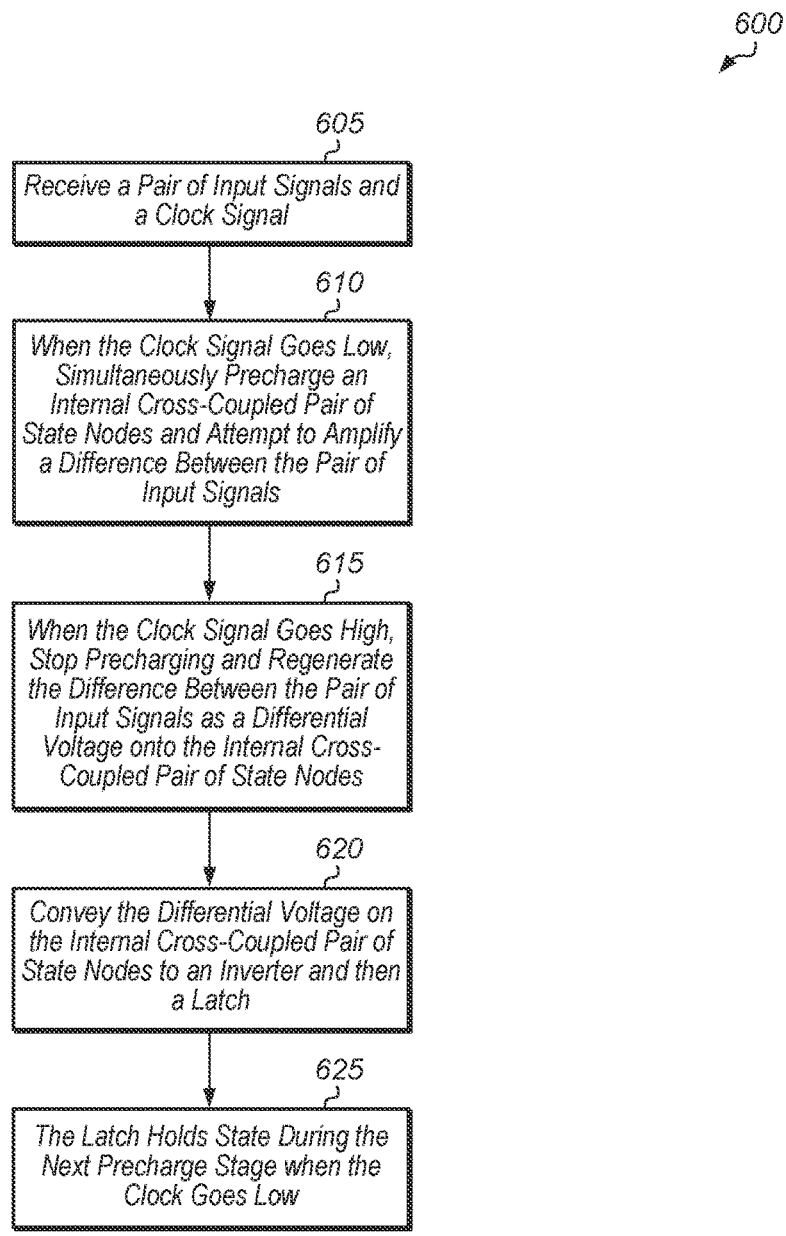
FIG. 6 is a generalized flow diagram illustrating one implementation of a method for implementing a sampling circuit with increased headroom.
Figure 7:
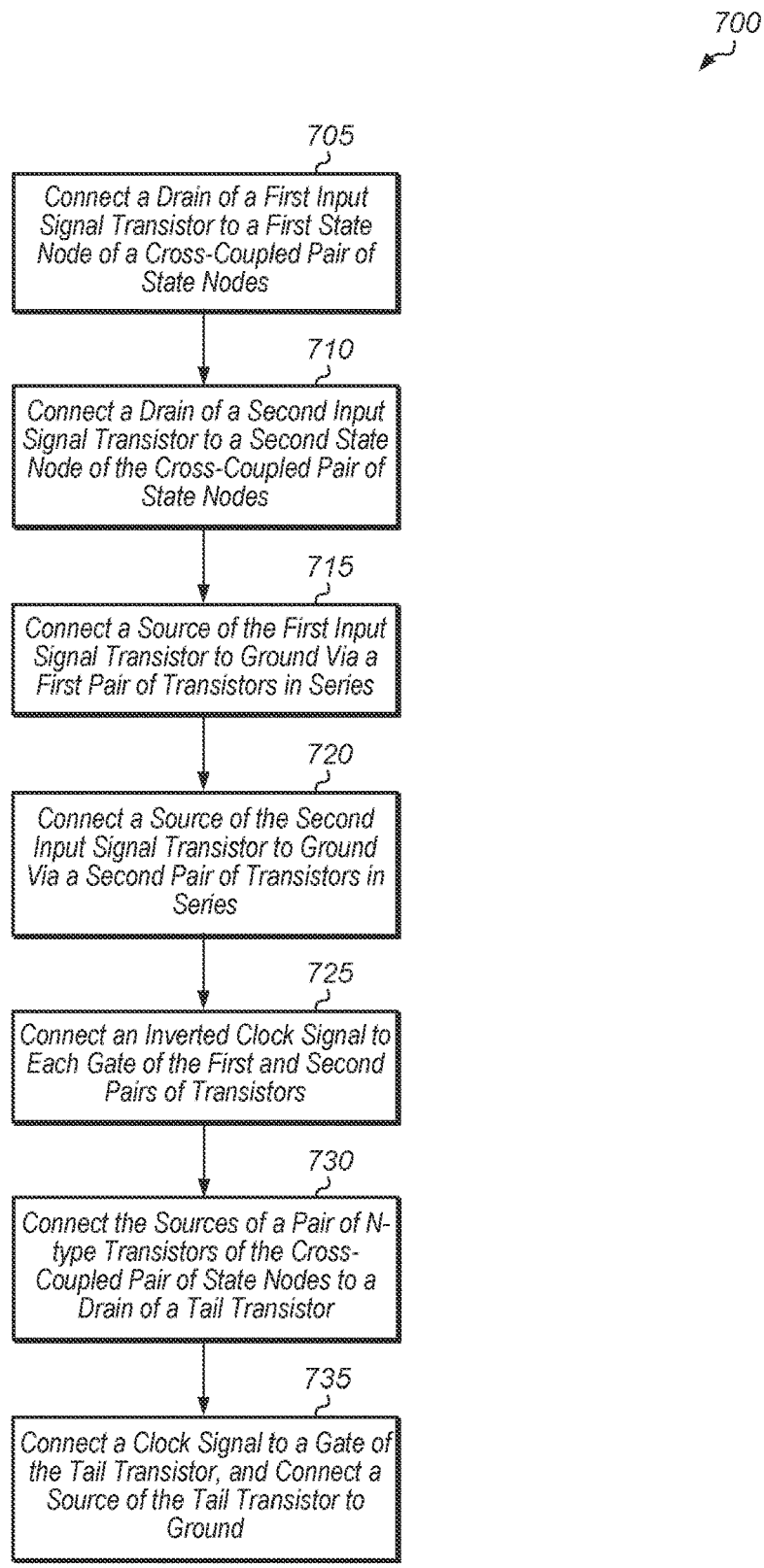
FIG. 7 is a generalized flow diagram illustrating one implementation of a method for implementing a sampling circuit with increased headroom.
Figure 8:
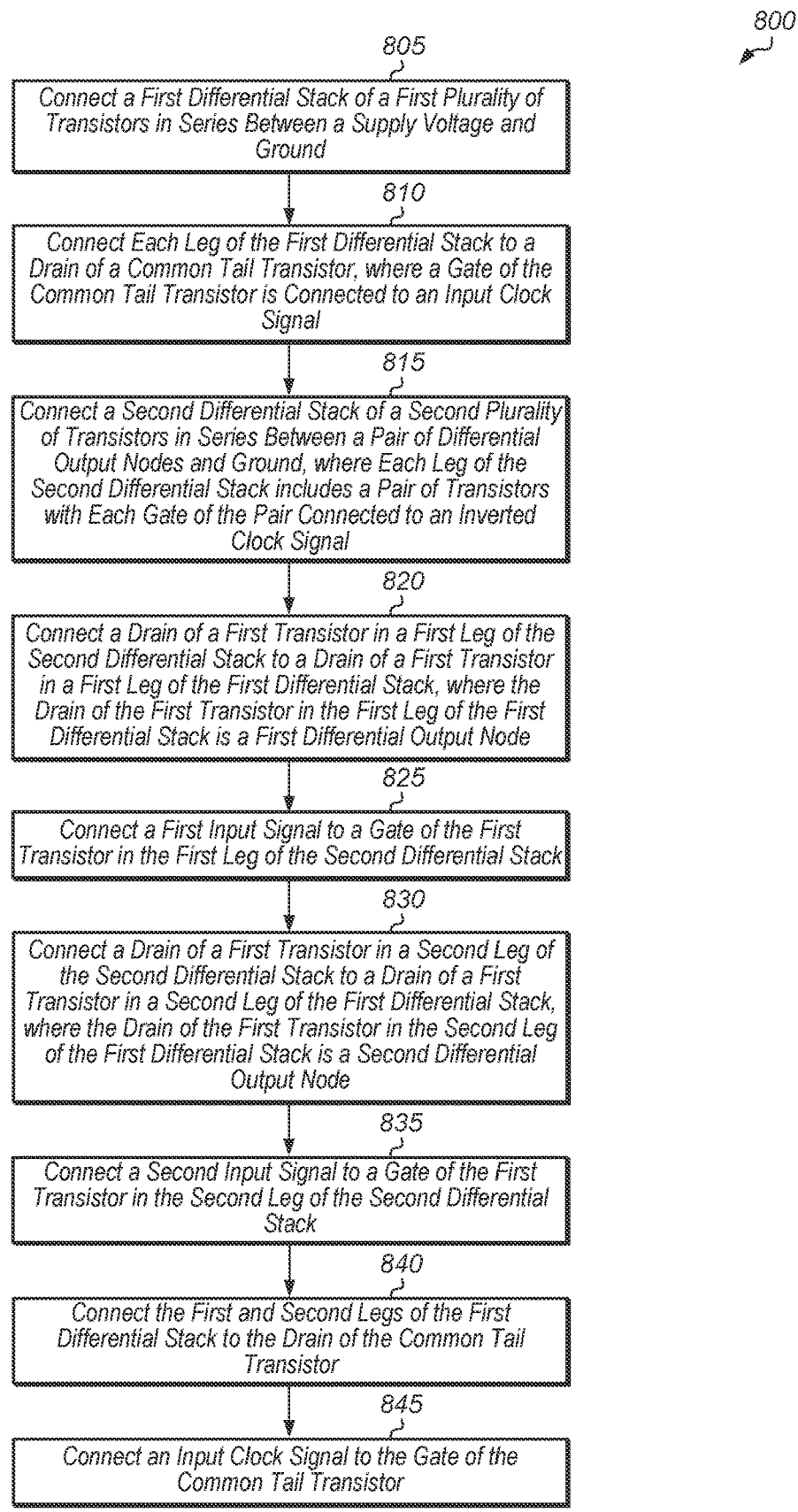
FIG. 8 is a generalized flow diagram illustrating one implementation of a method for implementing a sampling circuit with two separate stacks.

Turning now to FIG. 6, one implementation of a method 600 for implementing a sampling circuit with increasing headroom is shown. For purposes of discussion, the steps in this implementation and those of FIG. 7-8 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 600.

A circuit (e.g., circuit 500 of FIG. 5) receives a pair of input signals and a clock signal (block 605). In one implementation, the pair of input signals includes a single-ended data signal and a reference voltage. In another implementation, the pair of input signals includes a differential data signal. When the clock signal goes low, the circuit simultaneously precharges an internal cross-coupled pair of state nodes and attempts to amplify a difference between the pair of input signals (block 610). When the clock signal goes high, the circuit stops precharging and regenerates the difference between the pair of input signals as a differential voltage onto the internal cross-coupled pair of state nodes (block 615). Then, the differential voltage on the internal cross-coupled pair of state nodes is conveyed to an inverter and then a latch (e.g., a S-R latch) (block 620). The latch holds state during the next precharge stage when the clock goes low (block 625). After block 625, method 600 ends. It is noted that method 600 can be repeated for each clock cycle.

Referring now to FIG. 7, one implementation of a method 700 for implementing a sampling circuit with increased headroom is shown. A drain of a first input signal transistor (e.g., transistor 505 of FIG. 5) is connected to a first state node (e.g., the drain of transistor 515) of a cross-coupled pair of state nodes (block 705). A drain of a second input signal transistor (e.g., transistor 510) is connected to a second state node (e.g., the drain of transistor 520) of the cross-coupled pair of state nodes (block 710). In one implementation, the first and second input signal transistors are N-type MOSFET devices. It is noted that the first and second input signal transistors are referred to as "input signal" transistors because they each receive an input signal on their gate. In one implementation, the input signals received by the first and second input signal transistors are a single-ended signal and a reference signal. In another implementation, the input signals received by first and second input signal transistors are differential signal components.

A source of the first input signal transistor is connected to ground via a first pair of transistors in series (e.g., transistors 550 and 555) (block 715). A source of the second input signal transistor is connected to ground via a second pair of transistors in series (e.g., transistors 560 and 565) (block 720). In one implementation, the first and second pairs of transistors are N-type MOSFET devices. Also, an inverted clock signal is connected to each gate of the first and second pairs of transistors (block 725). Additionally, the sources of a pair of N-type transistors (e.g., transistors 515 and 520) of the cross-coupled pair of state nodes are connected to a drain of a tail transistor (e.g., transistor 535) (block 730). In one implementation, the pair of N-type transistors and the tail transistor are N-type MOSFET devices. Still further, a clock signal is connected to a gate of the tail transistor, and a source of the tail transistor is connected to ground (block 735). After block 735, method 700 ends. It is noted that method 700 can be implemented to create a circuit for sampling a pair of input signals and for generating a full rail output differential signal from the samples of the pair of input signals.

Turning now to FIG. 8, one implementation of a method 800 for implementing a sampling circuit with two separate stacks is shown. A first differential stack of a first plurality of transistors (e.g., transistors 525, 530, 515, 520, and 535 of FIG. 5) is connected in series between a supply voltage and ground (block 805). Each leg of the first differential stack is connected to a drain of a common tail transistor (e.g., transistor 535), where a gate of the common tail transistor is connected to an input clock signal (block 810). A second differential stack of a second plurality of transistors (e.g., transistors 545, 505, 550, 555, 540, 510, 560, and 565) is connected in series between differential output nodes and ground, where each leg of the second differential stack includes a pair of transistors with each gate of the pair connected to an inverted clock signal (block 815). A drain of a first transistor (e.g., transistor 505) in a first leg (e.g., transistors 505, 550, and 555) of the second differential stack is connected to a drain of a first transistor (e.g., transistor 525) in a first leg (e.g., transistors 525 and 515) of the first differential stack, where the drain of the first transistor in the first leg of the first differential stack is a first differential output node (block 820). A first input signal is connected to a gate of the first transistor in the first leg of the second differential stack (block 825). A drain of a first transistor (e.g., transistor 510) in a second leg (e.g., transistors 510, 560, and 565) of the second differential stack is connected to a drain of a first transistor (e.g., transistor 530) in a second leg (e.g., transistors 530 and 520) of the first differential stack, where the drain of the first transistor in the second leg of the first differential stack is a second differential output node (block 830). A second input signal is connected to a gate of the first transistor in the second leg of the second differential stack (block 835). The first and second legs of the first differential stack are connected to the drain of the common tail transistor (e.g., transistor 535) (block 840). An input clock signal is connected to the gate of the common tail transistor (block 845). After block 845, method 800 ends.

Figure 9:
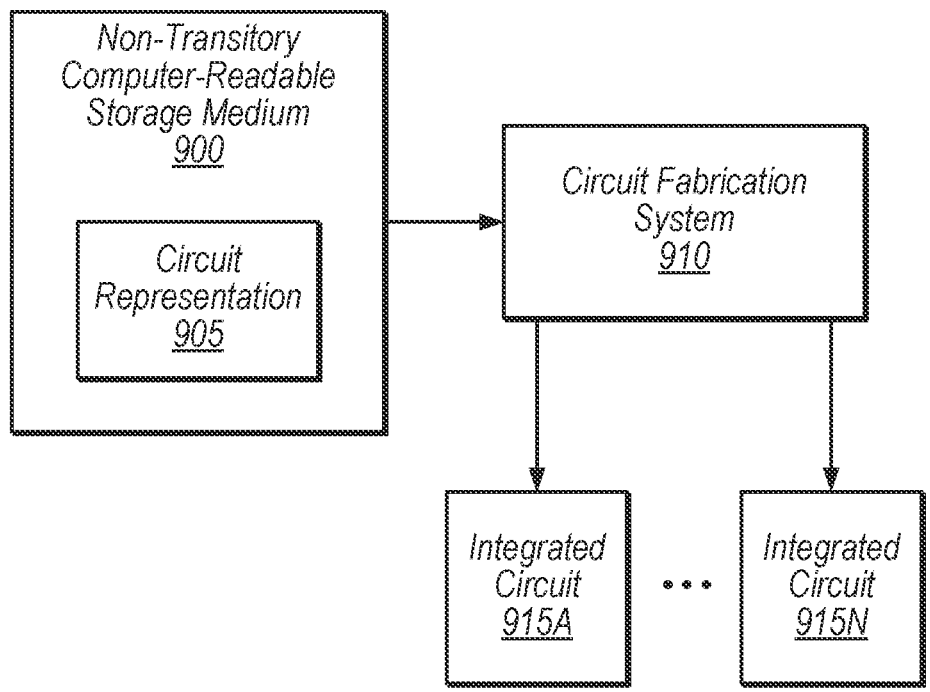
FIG. 9 is a block diagram illustrating one implementation of a non-transitory computer-readable storage medium that stores a circuit representation.

Referring now to FIG. 9, a block diagram illustrating one implementation of a non-transitory computer-readable storage medium 900 that stores a circuit representation 905 is shown. In one implementation, circuit fabrication system 910 processes the circuit representation 905 stored on non-transitory computer-readable storage medium 900 and fabricates any number of integrated circuits 915A-N based on the circuit representation 905.

Non-transitory computer-readable storage medium 900 can include any of various appropriate types of memory devices or storage devices. Medium 900 can be an installation medium (e.g., a thumb drive, CD-ROM), a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 900 can include other types of non-transitory memory as well or any combinations thereof. Medium 900 can include two or more memory mediums which reside in different locations (e.g., in different computer systems that are connected over a network).

In various implementations, circuit representation 905 is specified using any of various appropriate computer languages, including hardware description languages such as, without limitation: VHDL, Verilog, SystemC, SystemVerilog, RHDL, etc. Circuit representation 905 is usable by circuit fabrication system 910 to fabricate at least a portion of one or more of integrated circuits 915A-N. The format of circuit representation 905 is recognizable by at least one circuit fabrication system 910. In some implementations, circuit representation 905 includes one or more cell libraries which specify the synthesis and/or layout of the integrated circuits 915A-N.

Circuit fabrication system 910 includes any of various appropriate elements configured to fabricate integrated circuits. This can include, for example, elements for depositing semiconductor materials (e.g., on a wafer, which can include masking), removing materials, altering the shape of deposited materials, modifying materials (e.g., by doping materials or modifying dielectric constants using ultraviolet processing), etc. Circuit fabrication system 910 can also perform testing of fabricated circuits for correct operation.

In various implementations, integrated circuits 915A-N operate according to a circuit design specified by circuit representation 905, which can include performing any of the functionality described herein. For example, integrated circuits 915A-N can include any of various elements shown in circuit 500 (of FIG. 5) and/or multiple instances of circuit 500. Furthermore, integrated circuits 915A-N can perform various functions described herein in conjunction with other components. For example, integrated circuits 915A-N can be coupled to voltage supply circuitry that is configured to provide a supply voltage (e.g., as opposed to including a voltage supply itself). Further, the functionality described herein can be performed by multiple connected integrated circuits.

As used herein, a phrase of the form "circuit representation that specifies a design of a circuit . . . " does not imply that the circuit in question must be fabricated in order for the element to be met. Rather, this phrase indicates that the circuit representation describes a circuit that, upon being fabricated, will be configured to perform the indicated actions or will include the specified components.

In various implementations, program instructions are used to implement the methods and/or mechanisms described herein. For example, program instructions are written that describe the behavior or design of hardware. In one implementation, such program instructions are represented by a hardware design language (HDL) such as Verilog. In various implementations, the program instructions are stored on any of a variety of non-transitory computer readable storage mediums. The storage medium is accessible by a computing system during use to provide the program instructions to the computing system for circuit fabrication, program execution, or otherwise. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit configured to:
   receive a first clock signal;
   receive a first input signal on a gate of a first transistor, wherein a drain of the first transistor is a first output node and the first transistor is separated from a ground voltage by two transistors, each of the two transistors receiving a second clock signal on their respective gates; and
   receive a second input signal on a gate of a second transistor; and
   simultaneously precharge the first output node and a second output node of the circuit, and amplify a difference between the first input signal and the second input signal when the first clock signal has a first value.

2. The circuit as recited in claim 1, wherein the first and second output nodes are internal cross-coupled nodes.

3. The circuit as recited in claim 2, wherein the circuit is configured to stop said precharge when the first clock signal has a second value different from the first value.

4. The circuit as recited in claim 3, wherein when the first clock signal has the second value, the circuit is further configured to regenerate the difference as a differential voltage onto the first and second output nodes.

5. The circuit as recited in claim 4, wherein the circuit is configured to convey the differential voltage to a latch.

6. The circuit as recited in claim 1, wherein the circuit comprises a precharge stage and an evaluate stage different from the precharge stage.

7. The circuit as recited in claim 6, wherein each of the precharge stage and the evaluate stage comprise a differential stack.

8. The circuit as recited in claim 7, wherein each leg of the differential stack of the evaluate stage is coupled to a drain of a common transistor, and a gate of the common transistor is coupled to the first clock signal.

9. The circuit as recited in claim 8, wherein the second clock signal is an inverted value of the first clock signal.

10. A method comprising:
    receiving, in a circuit, a first clock signal; and
    receiving, in the circuit, a first input signal on a gate of a first transistor, wherein a drain of the first transistor is a first output node and the first transistor is separated from a ground voltage by two transistors, each of the two transistors receiving a second clock signal on their respective gates; and receiving, in the circuit, a second input signal on a gate of a second transistors; and simultaneously precharging the first output node and a second output node of the circuit, and amplify a difference between the first input signal and the second input signal when the first clock signal has a first value.

11. The method as recited in claim 10, wherein the first and second output nodes are internal cross-coupled nodes.

12. The method as recited in claim 11, further comprising stopping said precharging when the clock signal has a second value different from the first value.

13. The method as recited in claim 12, wherein when the first clock signal has the second value, the method comprises regenerating the difference as a differential voltage onto the first and second output nodes.

14. The method as recited in claim 13, further comprising conveying the differential voltage to a latch.

15. The method as recited in claim 10, wherein the circuit comprises a precharge stage and an evaluate stage different from the precharge stage.

16. The method as recited in claim 15, wherein each of the precharge stage and the evaluate stage comprise a differential stack.

17. The method as recited in claim 16, wherein each leg of the differential stack of the evaluate stage is coupled to a drain of a common transistor, and a gate of the common transistor is coupled to the first clock signal.

18. The method as recited in claim 17, wherein each leg of the differential stack of the precharge stage is coupled to an inverted value of the first clock signal.

19. A circuit comprising:

a cross-coupled pair of state nodes comprising a first output node; and a plurality of transistors;

wherein the circuit is configured to:

receive a first clock signal; and receive a first input signal on a gate of a first transistor, wherein a drain of the first transistor is the first output node and the first transistor is separated from a ground voltage by two transistors, each of the two transistors receiving a second clock signal on their respective gates; and receive a second input signal on a gate of a second transistor; and simultaneously precharge the cross-coupled pair of stage nodes, the cross-coupled pair of nodes being distinct from the first input signal and the second input signal, and amplify a difference between the first input signal and the second input signal when the first clock signal has a first value.

20. The circuit as recited in claim 19, wherein the circuit is configured to turn on a tail transistor to amplify the difference between the first input signal and the second input signal to generate an output signal on the cross-coupled pair of state nodes when the received first clock signal has a second value.

* * * * *